(12) United States Patent
Yasuda et al.

(10) Patent No.: US 8,116,633 B2
(45) Date of Patent: Feb. 14, 2012

(54) OPTICAL-ELECTRICAL TRANSCEIVER MODULE

(75) Inventors: Hiroki Yasuda, Mito (JP); Koki Hirano, Hitachinaka (JP)

(73) Assignee: Hitachi Cable, Ltd., Tokyo (JP)

(*) Notice: Subject to any disclaimer, the term of this patent is extended or adjusted under 35 U.S.C. 154(b) by 371 days.

(21) Appl. No.: 12/465,760

(22) Filed: May 14, 2009

(65) Prior Publication Data
US 2009/0285580 A1    Nov. 19, 2009

(30) Foreign Application Priority Data
May 15, 2008   (JP) ................. 2008-128817

(51) Int. Cl.
*H04B 10/12*   (2006.01)
*H04B 10/02*   (2006.01)
*G02B 6/12*    (2006.01)
(52) U.S. Cl. .......................... 398/139; 385/14
(58) Field of Classification Search ............. 398/139
See application file for complete search history.

(56) References Cited

U.S. PATENT DOCUMENTS
7,267,553 B2 *   9/2007   Sone .................. 439/67

FOREIGN PATENT DOCUMENTS
JP         2003-149512        5/2003

* cited by examiner

*Primary Examiner* — Omar Rojas
(74) *Attorney, Agent, or Firm* — Antonelli, Terry, Stout & Kraus, LLP.

(57) ABSTRACT

An optical-electrical transceiver module is to connect an optical-electrical composite cable incorporating an optical fiber and an electric wire to a receptacle of external electrical equipment. The module comprises a base; an optical path conversion element provided on the base; a flexible printed circuit sheet provided on the optical path conversion element and having electrical wiring; a support plate provided on the base to support the flexible printed circuit sheet; an optical element provided on the flexible printed circuit sheet; and an electric connector. The flexible printed circuit sheet is extended over the support plate and the base. The base, support plate, and flexible printed circuit sheet are connected to the electric connector by insertion into the electric connector.

9 Claims, 4 Drawing Sheets

OPTICAL-ELECTRICAL TRANSCEIVER MODULE

CLAIM OF PRIORITY

The present application claims priority from Japanese patent application serial No. 2008-128817 filed on May 15, 2008, the contents of which is hereby incorporated by references into this application.

BACKGROUND OF THE INVENTION

1. Field of the Invention

The present invention relates to an optical-electrical transceiver module for connecting an optical-electrical composite cable incorporating an optical fiber and an electric wire to external electrical equipment.

2. Description of Related Art

In order to meet increase in the amount of information with the rapid popularization of the Internet and multimedia, the development has been pursued in optical interconnection technologies for using optical signals in signal transmission between devices of processors. People expect smaller size and cost of optical-electrical transceiver modules.

Some conventional optical-electrical transceiver modules are constructed, for example, so that optical elements are horizontally arranged on a line at an end of a connector, and optical fibers are connected to these optical elements and each electrical signal is outputted from each optical element. (Refer to JP-A-2003-149512, for example.)

Incidentally, even in the case of using an optical interconnection, since not only transmissions of optical signals with optical fibers but also transmissions of electrical low-speed signals, power supply, grounding, and the like with electric wires are used, an optical-electrical composite cable incorporating an electric wire (including wires) and an optical fiber (including fibers) is used generally.

A conventional procedure example for connecting such an optical-electrical composite cable to external electrical equipment has been taken as illustrated in FIG. 5. That is, a glass epoxy plate 52 as a base with an electric wiring formed on the surface thereof is prepared; an optical fiber 54 of an optical-electrical composite cable 58 is placed so that one end of the optical fiber 54 is opposed to an optical element 53 mounted on the glass epoxy plate 52. At the same time, an electric wire 55 of the optical-electrical composite cable 58 is electrically connected to an input terminal Pi of the electric wiring. Then a connector 57 is electrically connected to output terminals Po of the glass epoxy plate 53 through cables 56.

Optical signals from the optical fiber 54 are converted to electrical signals through the optical element as an optoelectric conversion device 53 (or the optical element 53 and a driver) and outputted to the connector 57 through the cables 56 electrically connected to the output terminals Po. Similarly, electrical signals from the electric wire 55 inputted to the input terminal Pi are outputted to the connector 57 through the cables 56 electrically connected to the output terminals Po.

In the optical-electrical transceiver module 51, when the connector 57 is electrically connected to external the electrical equipment, the optical-electrical composite cable 58 is thereby connected to the external electrical equipment. In the description with reference to FIG. 5, a case where one optical fiber 54 and one electric wire 55 are provided has been taken as an example for the simplification of the drawing. However, the foregoing also applies to cases where multiple optical fibers 54 and electric wires 55 are provided.

According to the conventional optical-electrical transceiver module 51, the glass epoxy plate 52 and the connector 57 are formed separately from each other and it is required to connect the output terminals Po formed on the glass epoxy plate 52 and the connector 57 with each other through the cables 56. Therefore, when the optical-electrical transceiver module 51 is packaged, the overall size thereof may be increased. In addition, when the optical fibers 54 and the electric wire 55 are increased in number, the size of the glass epoxy plate 52 may be increased.

Furthermore, according to the structure of the optical-electrical transceiver module 51 in which the output terminals Po formed on the glass epoxy plate 52 and the connector 57 are electrically connected with each other through the cables 56, the more optical fiber 54 and the electric wire 55 in number, the more wiring is complicated and further it is required to use the glass epoxy plate 52 with an electric wiring formed thereon. Therefore, the structure may make an increase in cost.

SUMMARY OF THE INVENTION

The present invention is to provide an optical-electrical transceiver module integrated with a connector in order to solve the above problems and get size reduction and cost reduction for the module.

The present invention is constructed as follows to achieve the above object.

The optical-electrical transceiver module of the present invention is to connect an optical-electrical composite cable incorporating an optical fiber and an electric wire to a receptacle of external electrical equipment. The optical-electrical transceiver module mainly comprises: a base; an optical path conversion element provided on the base and optically coupled to the optical fiber to change a direction of an optical path; a flexible printed circuit sheet provided on the optical path conversion element and having electrical wiring to be electrically connected to the electric wire of the optical-electrical composite cable; a support plate provided on the base to support the flexible printed circuit sheet; an optical element provided on the flexible printed circuit sheet and optically coupled to the core of the optical fiber through the optical path conversion element; and an electric connector electrically connected to the electrical wiring of the flexible printed circuit sheet and connectable to the receptacle of the external electrical equipment by insertion into the receptacle. The flexible printed circuit sheet is extended over the support plate and the base, in a state of being folded at tip portions the support plate and the base in the axial direction of the module or at side-to-side opposite sides of the support plate and the base in the width direction of the module, so as to envelop the tip portions or side-to-side opposite sides and be further bonded to the reverse side of the base. The base, support plate, and flexible printed circuit sheet are connected to the electric connector by insertion into the electric connector.

Furthermore, the optical-electrical transceiver module may have the following optional arrangement.

First option: The flexible printed circuit sheet may be provided so that the flexible printed circuit sheet is extended over the right side of the support plate and the reverse side of the base in the axial direction of the optical-electrical transceiver module, and right side electric wirings and right-reverse side electric wirings formed on the flexible printed circuit sheet are alternately disposed respectively.

Second option: The flexible printed circuit sheet is extended over the right side of the support plate and the reverse side of the base in the width direction of the base and support plate; and the electric wirings at the right side of the flexible printed circuit sheet and the electric wirings at the right-reverse sides of the flexible printed circuit sheet are bilaterally symmetrically disposed in the width direction of the base and support plate.

Third option: The optical path conversion element is comprised of an optical waveguide; and the base is provided with a groove for mounting the optical fiber and optically coupling the core of the optical fiber and the core of the optical waveguide with each other.

Fourth option: The total thickness of the base, the support plate, and flexible printed circuit sheet extended over the right side of the support palate and the reverse side of the base, at the tip side of the support plate and the base, is set so as to fit into between upper and lower metal terminals formed in the electric connector.

Fifth option: The optical path conversion element and the optical fiber are optically coupled to each other on the right side of the base; and the electrical wiring on the flexible printed circuit sheet and the electric wire of the optical-electrical composite cable are electrically connected with each other on the reverse side of the base.

Sixth option: The present invention may be constructed as follows.

An optical-electrical transceiver module is also to connect an optical-electrical composite cable incorporating an optical fiber and an electric wire to a receptacle of external electrical equipment. The optical-electrical transceiver module comprises: a base; the optical fiber provided on the base and having an optical path conversion element provided at the external electrical equipment side of the optical fiber; the optical path conversion element for changing a direction of an optical path; a flexible printed circuit sheet provided on the optical path conversion element and having electrical wiring to be electrically connected to the electric wire of the optical-electrical composite cable; an optical element provided on the flexible printed circuit sheet and optically coupled to the core of the optical fiber through the optical path conversion element; a support plate provided on the base to support the flexible printed circuit sheet; and an electric connector electrically connected to the electrical wiring of the flexible printed circuit sheet and connectable to the receptacle of the external electrical equipment by insertion into the receptacle. The flexible printed circuit sheet is extended over the support plate and the base, in a state of being folded at tip portions in the axial direction of the module or at side-to-side opposite sides of the support plate and the base in the width direction of the module, so as to envelop the tip portions or side-to-side opposite sides and be further bonded to the reverse side of the base. The base, support plate, and flexible printed circuit sheet are connected to the electric connector by insertion into the electric connector.

According to the invention, it is possible to form an optical-electrical transceiver module so that the tip of the base is enveloped with a flexible printed circuit sheet. Further, it is possible to insert and link these base and sheet to between the metal terminals of the electric connector and thereby directly connect an electric wiring formed on flexible printed circuit sheet to the metal terminals of the electric connector. This obviates necessity for an FPC connector or a substrate with an electric wiring formed thereon and thus it is possible to reduce the cost and size of the module.

DETAILED DESCRIPTION OF THE PREFERRED EMBODIMENTS

Hereafter, description will be given to a preferred embodiment of the invention with reference to the accompanying drawings.

Figure 1:
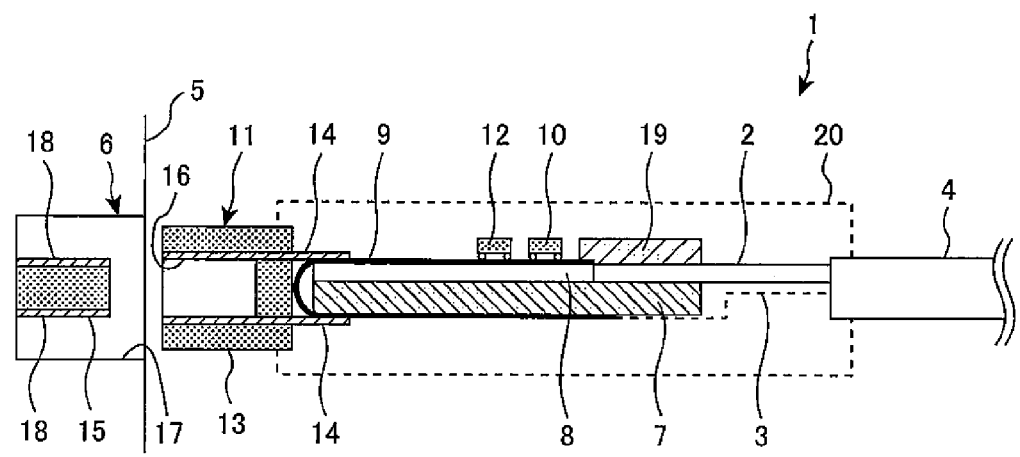
FIG. 1 is a longitudinal sectional view of an optical-electrical transceiver module of an embodiment of the present invention.

FIG. 1 is a longitudinal sectional view of an optical-electrical transceiver module in a first embodiment. The optical-electrical transceiver module 1 is used to connect an optical-electrical composite cable 4 incorporating comprising an optical fiber 2 and an electric wire 3 to external electrical equipment 5. The optical-electrical transceiver module 1 is configured to convert electrical signals from the external electrical equipment 5 to optical signals and outputs them to the optical fiber 2, or contrarily to convert optical signals from the optical fiber 2 to electrical signals and outputs them to the external electrical equipment 5.

The optical-electrical transceiver module 1 is mainly comprised of: a base 7 formed of a high-strength material such as glass plate, metal plate, or rigid plate; an optical waveguide (optical path conversion element) 8 formed on the base 7 and optically coupled to the optical fiber 2 of the optical-electrical composite cable 4; a flexible printed circuit sheet 9 being optically transparent at appropriate wavelength and provided on the optical waveguide 8; an optical element 10 as an opto-electric conversion device 10 mounted on the flexible printed circuit sheet 9 to convert optical signals from the optical waveguide 8 to electrical signals or contrarily to convert electrical signals from the flexible printed circuit sheet 9 to optical signals; IC (Integrated circuit) 12 that controls the optical element 10; and an electric connector 11 capable of fitting into a receptacle 6 provided to the external electrical equipment 5. The base 7 and the optical waveguide 8 are bonded together with adhesive and the optical waveguide 8 and the flexible printed circuit sheet 9 are bonded together with adhesive as well.

A part of the optical fiber 2 is mounted on the base 7 at the rear end side (on the right side of the sheet as people face it in FIG. 1) of the optical waveguide 8. In addition, a groove (omitted in drawings) for optically coupling the core of the optical fiber 2 and the core of the optical waveguide 8 with each other therein is formed on the base 7. The optical fiber 2 is mounted into the groove and is optically connected with the optical waveguide 8. A fiber cover plate 19 for preventing the optical fiber 2 from falling off is provided over the optical fiber 2.

The flexible printed circuit sheet 9 is provided on the optical waveguide 8. The flexible printed circuit sheet 9 is extended over the optical wave guide 8 and the base 7 in a state of being folded at tip portions 24 of the optical wave guide 8 and the base 7 so as to envelop the tip portions 24 and be further bonded to the reverse side of the base 7. A part (folded part at the tip portions 24) of the flexible printed circuit sheet 9 is extended off the tips 24 (namely extended to the left side in FIG. 1) of the base 7 and the optical waveguide 8 in an axial direction of the optical fiber 2. The part of the flexible printed circuit sheet 9 is bonded to the underside (reverse side) of the base 7 with adhesive or the like. The extended portion 25 has a folded radius with the extent to which the flexible printed circuit sheet 9 and/or an electric wiring is not broken.

The portion of the flexible printed circuit sheet 9 positioned on the reverse side of the base 7 is electrically connected with the electric wire 3 of the optical-electrical composite cable 4. The electric wire 3 and the electric wiring of the flexible printed circuit sheet 9 are electrically connected with each other with solder or the like.

The optical element 10 and the IC 12 for controlling the optical element 10 are provided on the flexible printed circuit sheet 9. The optical element 10 is comprised of a light receiving element such as PD (Photo Diode) or a light emitting element such as LD (Laser Diode). The optical element 10 and the IC 12 are electrically connected to the electric wiring on the flexible printed circuit sheet 9.

The extended part 25 of the flexible printed circuit sheet 9, which is formed so as to envelop the tips of the base 7 and the optical waveguide 8, is inserted and joined to the electric connector 11 used as a plug to the receptacle 6, and thereby electrically connected to the electric connector 11 by plug-in insertion.

The electric connector 11 comprises a connector cover 13 and a pair of metal terminals 14 protruded from the rear end the connector. The metal terminals 14 are disposed vertically in parallel to each other. The extended part 25 of the flexible printed circuit sheet 9 is inserted into between these metal terminals 14 of the electric connector 11. The metal terminals 14 and the electric wiring of the flexible printed circuit sheet 9 are electrically connected to each other with solder or the like.

It is advisable that the thickness of the end portion comprised of the part of the flexible printed circuit sheet 9 enveloping the base 7, the optical waveguide 8, and the tip of the optical waveguide 8 should be suitable for fitting into between the metal terminals 14. It is advisable that the thickness of this end portion should be adjusted by adjusting the thickness of the base 7.

In this embodiment, the distance between the upper and lower metal terminals 14 is set to 1 mm and polyimide (modulus of elasticity: 2 GPa) is used for the material of the flexible printed circuit sheet 9.

The electric connector 11 is provided with a hollow portion 16 for inserting a protruded portion 15 formed in the receptacle 6 of the external electrical equipment. The metal terminals 14 are extended into the hollow portion 16 so that the tips of the metal terminals 14 is aligned on a vertical line at the tip end of the connector cover 13.

A protective cover 20 profiled with a dotted line is provided so as to cover an area extending from the rear end side portion of the electric connector 11 to the tip end side portion of the optical-electrical composite cable 4.

The receptacle 6 of the external electrical equipment 5 is comprised of an electric connector insertion hole 17 for inserting the connector cover 13 and the protruded portion 15 engaged with the hollow portion 16 of the electric connector 11. The upper and lower faces of the protruded portion 15 are respectively provided with connecting terminals 18 that is brought into contact and electrically connected with either of the metal terminals 14 when the protruded portion is engaged with the hollow portion 16.

Figure 2:
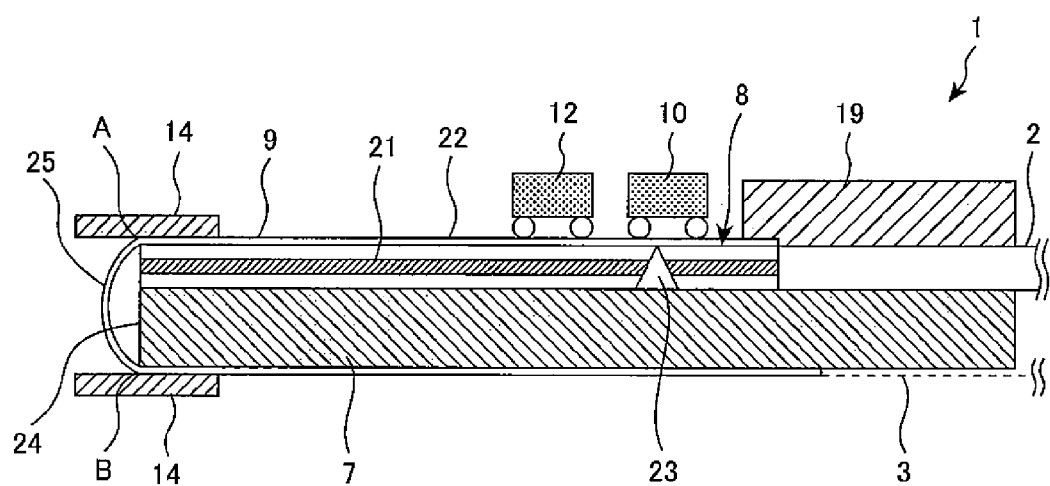
FIG. 2 is an enlarged view of a substantial part of FIG. 1.

More detailed description will be given to the optical waveguide 8 with reference to FIG. 2. As illustrated in FIG. 2, the optical waveguide 8 is comprised of a core 21 and a cladding 22. The optical waveguide 8 is used as an optical path converting means. The core 21 is provided with a mirror 23 for optically connecting the optical waveguide 8 with the optical element 10 mounted on the flexible printed circuit sheet 9.

The mirror 23 is obliquely provided at an angle of 45 degrees to the optical axis of light propagated through the core 21. The mirror reflects light propagated in the core 21 from the optical fiber 2 to the optical element 10 and reflects light from the optical element 10 toward the core 21 of the optical fiber 2.

In the optical wave guide 8 of FIG. 2, the portion positioned on the left side with respect to the mirror 23, namely the portion from the mirror to the tip of the base 7, functions as a support plate for supporting the flexible printed circuit sheet 9. Without the portion from the mirror to the tip of the base 7 in the optical waveguide 8, the flexible printed circuit sheet 9 would have a bent portion and it would be required to design the module so that the IC is not positioned at this bent portion. As mentioned above, the optical waveguide 8 as an optical path converting means may also be used as a support plate.

Figure 3:
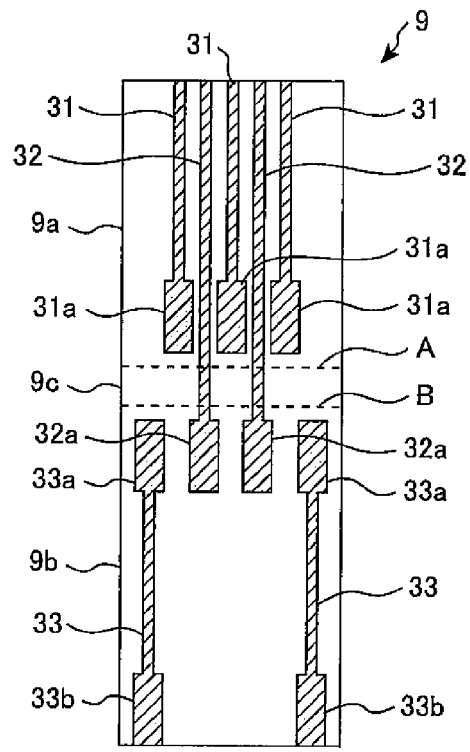
FIG. 3 is a plan developed view of a flexible printed circuit sheet used in the optical-electrical transceiver module of the present invention.

Description will be given to an example of the electric wiring of the flexible printed circuit sheet 9 used in the optical-electrical transceiver module 1 with reference to FIG. 3. FIG. 3 is a plan developed view of the flexible printed circuit sheet 9.

In the developed flexible printed circuit sheet 9 in FIG. 3, dotted line A indicates a folded position corresponding to the tip (refer to a sign A of FIG. 2) of the optical waveguide 8 (right side of the base 7) and dotted line B indicates a folded position corresponding of tip (refer to a sign B of FIG. 2) of the reverse side of the base 7 when the flexible printed circuit sheet 9 is folded as shown in FIGS. 1 and 2. More specific description will be given as follows. The right side portion 9a above the dotted line A in FIG. 3 is placed on the optical waveguide 8 and the reverse side portion 9b under the dotted line B is placed on the reverse side of the base 7. The folded portion 9c between the dotted lines A, B is placed at the tip faces 24 of the base 7 and the optical waveguide 8 and becomes the extended portion 25.

In the right side portion 9a of the flexible printed circuit sheet 9, multiple (three in the example in FIG. 3) electric wirings 31 are formed to electrically connect the upper metal terminal 14 and the optical element 10 or the IC 12 with each other. In each electric wiring 31, a wide terminal portion 31a for electrical connection with the metal terminal 14 is formed at the tip side (dotted line A side) of each electric wiring 31 on the right side portion 9a.

Multiple (two in the example in FIG. 3) electric wirings 32 are formed extending over right and reverse sides of the flexible printed circuit sheet 9. These electric wirings are extended from the right side portion 9a of the flexible printed circuit sheet 9 to the end of the reverse side portion 9b by way of the folded portion 9c between the dotted lines A, B. These right-reverse side electric wirings 32 are used to electrically connecting the optical element 10 or the IC 12 and the lower metal terminal 14 with each other. At the tip side of the right-reverse side electric wirings 32 on the reverse side portion 9b side, wide terminal portions 32a for electrical connection with the lower metal terminal 14 are respectively formed.

It is advisable that these right side electric wirings 31 and right-reverse side electric wirings 32 should be alternately disposed. This makes it possible to vertically displace the wide terminal portions 31a, 32a from each other and increase the number of flexible printed circuit sheets 9 that can be cut from a mother sheet.

Multiple (two in the example in FIG. 3) reverse side electric wirings 33 are formed on the reverse side portion 9b of the flexible printed circuit sheet 9. These electric wirings are used to electrically connect an electric wire 3 of the optical-electrical composite cable 4 and the lower metal terminal 14 with each other. A terminal portion 33a for electrical connection with the lower metal terminal 14 is formed at the tip (dotted line B side) of each reverse side electric wiring 33. A terminal portion 33b for electric wire connection with an electric wire 3 is formed at the rear end portion of each reverse side electric wiring.

When the flexible printed circuit sheet 9 illustrated in FIG. 3 is used, it is advisable that the metal terminals 14 of the electric connector 11 should be formed in a shape corresponding to the terminal portions 31a, 32a, 33a so that the following is implemented: the metal terminals are electrically connected with the terminal portions 31a, 32a, 33a of the individual electric wirings 31, 32, 33. Specifically, it is advisable, for example, that multiple metal plates corresponding to the individual terminal portions 31a, 32a, 33a should be disposed in a comb shape to construct the metal terminals 14. In this case, a supporting member for supporting each metal plate of the metal terminals 14 may be provided to reinforce the metal terminals 14.

Description will be given to the action of this embodiment. In the optical-electrical transceiver module 1, the optical waveguide 8 is provided on the base 7 and the flexible printed circuit sheet 9 is provided on the optical waveguide 8. The flexible printed circuit sheet 9 is folded so that the tip faces 24 of the base 7 and the optical waveguide 8 are enveloped therewith. Then the sheets and optical waveguide is capable of being inserted and linked to between the metal terminals 14 of the electric connector 11.

As mentioned above, according to the configuration of enveloping the base 7 by the flexible printed circuit sheet 9 and inserting the flexible printed circuit sheet 9 with the base 7 between the metal terminals 14 of the electric connector 11, the terminal portions 31a, 32a, 33a of the electric wirings on the flexible printed circuit sheet 9 can be directly electrically connected to the metal terminals 14. This obviates necessity for an FPC connector for fixing the flexible printed circuit sheet 9 or a base with an electric wiring formed thereon and it is possible to reduce cost and size as compared with conventional optical-electrical transceiver modules.

In general, an exclusive support member for supporting the optical fiber 2 has been provided in the conventional art in which the optical fiber is optically connected to an optical waveguide. In the optical-electrical transceiver module 1 of the present embodiment of the present invention, meanwhile, the base 7 since also functions as a support member for the optical fiber 2, cost of the module can be further reduced.

In addition, according to the embodiment, since the right side electric wirings 31 and the right-reverse side electric wirings 32 of the flexible printed circuit sheet 9 are alternately disposed, the wide terminal portions 31a, 32a can be vertically displaced from each other and space saving can be achieved. As a result, it is possible to increase the number of wirings formed on the flexible printed circuit sheet 9 and increase the number of flexible printed circuit sheets 9 that can be cut from a mother sheet.

Further, in the optical-electrical transceiver module 1, the optical fiber 2 is connected on the right side of the base 7 and the electric wire 3 is connected on the reverse side of the base 7. This enables further space saving and size reduction.

Description will be given to another embodiment of the invention.

Figure 4:
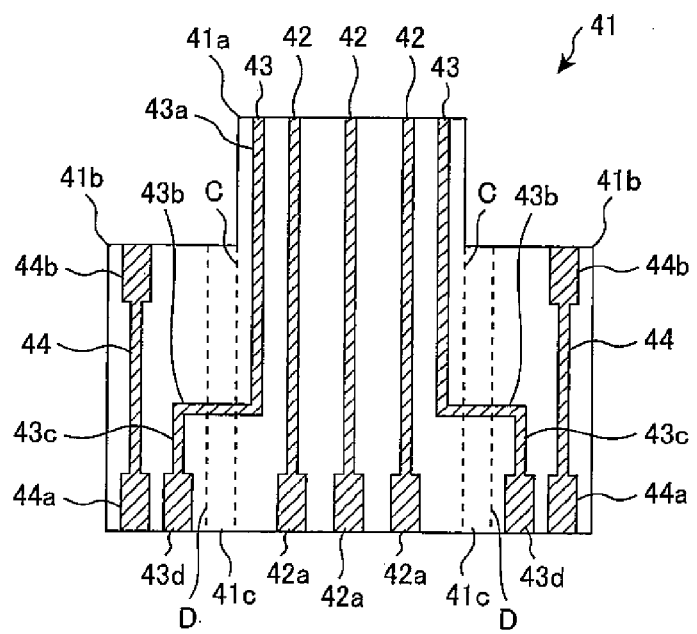
FIG. 4 is a plan view of a flexible printed circuit sheet used in an optical-electrical transceiver module in another embodiment of the invention.
Figure 5:
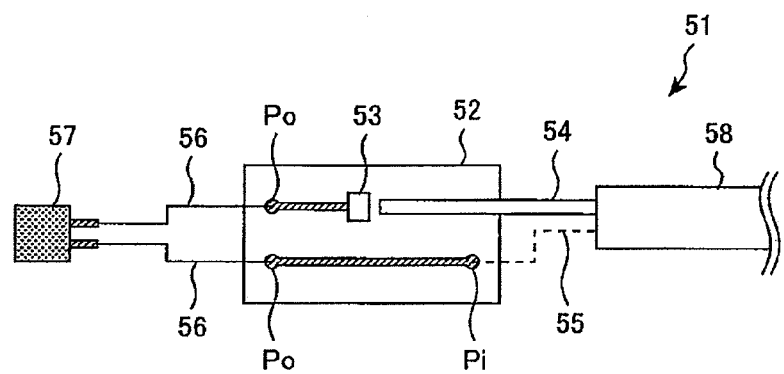
FIG. 5 is a plan view of a conventional optical-electrical transceiver module.

FIG. 4 illustrates a plan developed view of a flexible printed circuit sheet 41 as the flexible printed circuit sheet 9 in place of the flexible printed circuit sheet 31. The flexible printed circuit sheet 41 is used in an optical-electrical transceiver module in another embodiment of the invention. The configuration of this optical-electrical transceiver module is the same as the configuration of the optical-electrical transceiver module 1 in FIG. 1 except that the flexible printed circuit sheet 41 is used.

The flexible printed circuit sheet 41 is extended over the optical waveguide (support plate) 8 and the base 7 in a state of being folded at side-to-side opposite sides of the support plate and the base in the width direction of the module, so as to envelop side-to-side opposite sides and be further bonded to the reverse side of the base 7.

In the flexible printed circuit sheet 41 of FIG. 4, dotted lines C are positioned at opposite sides of the optical waveguide 8 on the base 7 and dotted lines D are positioned on under side (re) the sides of the reverse side of the base 7 when the flexible printed circuit sheet 41 is folded at opposite sides thereof. In the folded state of the flexible printed circuit sheet 41, the right side portion 41a between the dotted lines (C, C) is placed on the optical waveguide 8 and the reverse side portions 41b outside the dotted lines D are placed on the reverse side of the base 7. The folded portion 41c between each dotted line C and the corresponding dotted line D is placed on the side faces of the optical waveguide 8 and the base 7 on the corresponding side.

In the right side portion 41a of the flexible printed circuit sheet 41, multiple (three in the example in FIG. 4) electric wirings 42 are formed to electrically connect the upper metal terminal 14 and the optical element 10 or the IC 12 with each other. In each electric wiring 42, a wide terminal portion 42a for electrical connection with the metal terminal 14 is formed at the tip side (lower side in FIG. 4) of each electric wiring 42 on the right side portion 41a.

Multiple (two in the example in FIG. 4) electric wirings 43 are formed so that these electric wirings cross the folded portions 41c on the way thereof and are extended from the right side portion 41a of the flexible printed circuit sheet 41 to the tip of the corresponding reverse side portion 41b. These right-reverse side electric wirings 43 are used to electrically connect the optical element 10 or the IC 12 and the lower metal terminal 14 with each other.

Each right-reverse side electric wiring 43 is comprised of: a right side longitudinal line portion 43a extending from the rear end (upper side in FIG. 4) of the right side portion 41b in the longitudinal direction; a lateral line portion 43b extending from the right side longitudinal line portion 43a in the lateral (width) direction of width, crossing the folded portion 41c; and a reverse side longitudinal portion 43c extending from this lateral portion 43b to the tip side of the corresponding reverse side portion 41b in parallel with the axial direction. A wide terminal portion 43d for electrical connection with the lower metal terminal 14 is formed at the tip side of each reverse side longitudinal portion 43c. These right-reverse side electric wirings 43 are formed outside the right side of the electric wirings 42.

Multiple (two in the example in FIG. 4) electric wirings 44 are formed on the reverse side portions 41b of the flexible printed circuit sheet 41. These reverse side electric wirings are used to electrically connect the electric wire 3 of the optical-electrical composite cable 4 and the lower metal terminal 14 with each other. Each terminal portion 44a for electrical connection with the lower metal terminal 14 is formed at the tip (lower side in FIG. 4) of each reverse side electric wiring 44. A terminal portion 44b for electric wire connection for electrical connection with an electric wire 3 is formed at the rear end portion of each reverse side electric wiring.

It is advisable that in the flexible printed circuit sheet 41, electric wirings should be bilaterally symmetrically formed in terms of ease of handling.

In the above embodiments, the optical waveguide 8 is formed on the base 7 and the flexible printed circuit sheet (9, 41) is formed on the optical waveguide 8. Instead, the following procedure may be taken: first, the optical waveguide 8 is formed on the reverse side of the flexible printed circuit sheet (9, 41) and then the base 7 is enveloped with the flexible printed circuit sheet. In this case, if the optical waveguide 8 is formed throughout the overall length of the flexible printed circuit sheet (9, 41), the bend radius of the flexible printed circuit sheet (9, 41) will be increased. Consequently, it is advisable to form the optical waveguide 8 only on the portion of the flexible printed circuit sheet (9, 41) positioned on the right side of the base 7.

Figure 6:
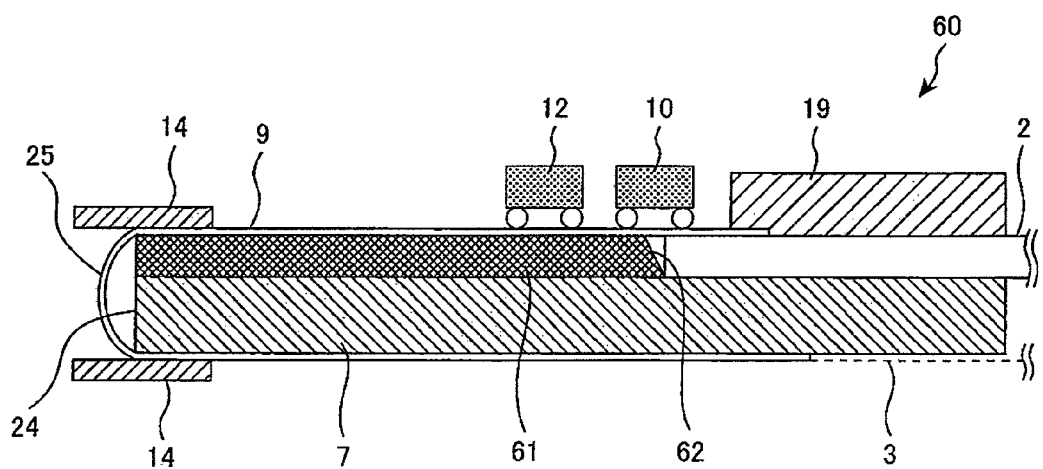
FIG. 6 is an enlarged longitudinal sectional view of a substantial part of an optical-electrical transceiver module in a modification to the present invention.

In the description of the above embodiments, cases where the optical waveguide 8 is used as the optical path conversion element have been taken as examples. As illustrated in FIG. 6, instead, an optical lens block 61 having a 45-degree sloped portion 62, which is provided at the side of the optical fiber 62, may be used as the optical path conversion element. The optical element 10 and the core of the optical fiber 2 are optically coupled to each other through the 45-degree sloped portion 62 formed in this optical lens block 61. In place of this optical lens block 61, the following measure may be taken: a metal block having a 45-degree sloped portion at the side of the optical fiber 2 is used to change the direction of the optical path by 90 degrees to optically couple the optical element 10 and the core of the optical fiber 2 to each other.

Figure 7:
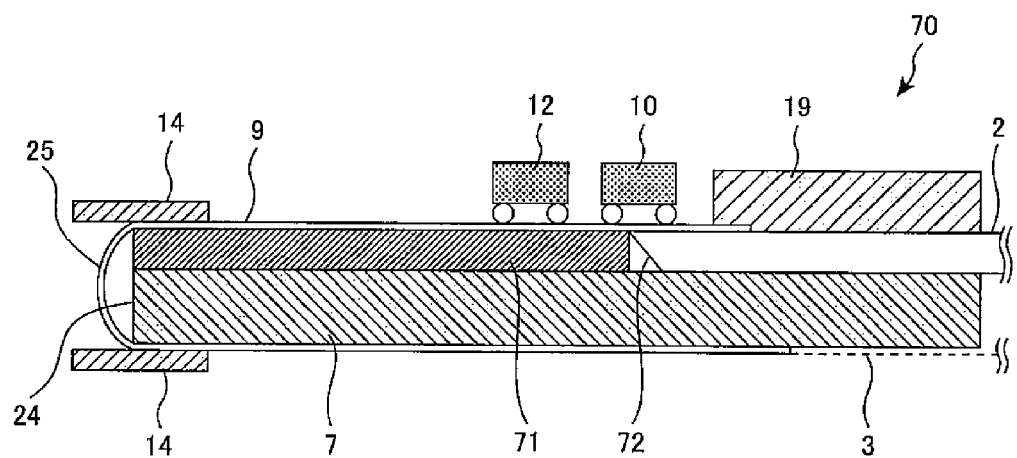
FIG. 7 is an enlarged longitudinal sectional view of a substantial part of an optical-electrical transceiver module in a modification to the present invention.

Instead, the measure illustrated in FIG. 7 may be taken. That is, the tip of the optical fiber 2 on the external electrical equipment side is obliquely polished at an angle of 45 degrees. Au is deposited on this polished portion to obtain an optical path conversion portion 72. The optical fiber 2 having the optical path conversion portion is used to convert the optical path by 90 degrees. Since the optical path is converted by 90 degrees at the Au deposited portion of the optical fiber 2, the optical element 10 and the core of the optical fiber 2 are optically coupled to each other through this optical path conversion portion 72. In this case, it is advisable to provide a support plate 71 for supporting the flexible printed circuit sheet 9. Without the support plate 71, the flexible printed circuit sheet 9 would have a bent portion and it would be required to design the module so that the IC 12 is not positioned at this bent portion. The support plate 71 is formed of such a material as glass plate, metal plate, or rigid base and may be formed integrally with the base 7.

Figure 8:
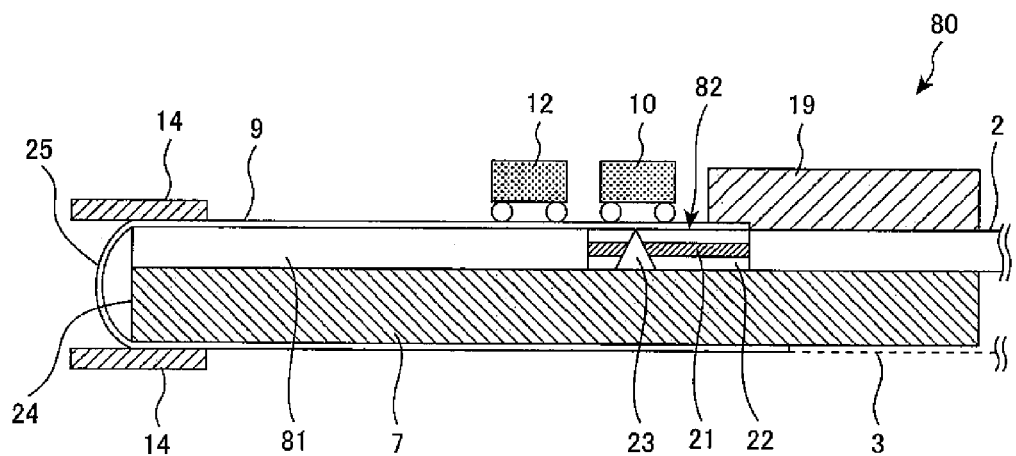
FIG. 8 is an enlarged longitudinal sectional view of a substantial part of an optical-electrical transceiver module in a modification to the present invention.

The measure illustrated in FIG. 8 may be taken. That is, an optical waveguide 82 having a mirror 23 as an optical path converting means only directly under the optical element 10 is formed. The core of the optical fiber 2 and the optical element 10 are optically coupled to each other through this mirror 23. Also in this case, it is advisable to provide a support plate 81 for supporting the flexible printed circuit sheet 9. Without this support plate 81, the flexible printed circuit sheet 9 would have a bent portion and it would be required to design the module so that the IC 12 is not positioned at this bent portion. This support plate 81 is formed of such a material as glass plate, metal plate, or rigid base and may be formed integrally with the base 7. In place of the optical waveguide 82, the following measure may be taken: a metal block having a 45-degree sloped portion on the optical fiber 2 side is formed only directly under the optical element 10 to convert the optical path by 90 degrees and the optical element 10 and the core of the optical fiber 2 are optically coupled to each other.

Although the invention has been described with respect to specific exemplary embodiments for complete and clear disclosure, the appended claims are not to be thus limited but are to be construed as embodying all modifications and alternative constructions that may occur to one skilled in the art which fairly fall within the basic teaching herein set forth.

It is noted that Applicant's intent is to encompass equivalents of all claim elements, even if amended late during prosecution.

What is claimed is:

1. An optical-electrical transceiver module for connecting an optical-electrical composite cable incorporating an optical fiber and an electric wire to a receptacle of external electrical equipment, comprising:
    a base;
    an optical path conversion element provided on the base and optically coupled to the optical fiber to change a direction of an optical path;
    a flexible printed circuit sheet provided on the optical path conversion element and having electrical wiring to be electrically connected to the electric wire of the optical-electrical composite cable;
    a support plate provided on the base to support the flexible printed circuit sheet;
    an optical element provided on the flexible printed circuit sheet and optically coupled to the core of the optical fiber through the optical path conversion element; and
    an electric connector electrically connected to the electrical wiring of the flexible printed circuit sheet and connectable to the receptacle of the external electrical equipment by insertion into the receptacle,
    wherein the flexible printed circuit sheet is extended over the support plate and the base, in a state of being folded at tip portions of the support plate and the base in the axial direction of the module or at side-to-side opposite sides of the support plate and the base in the width direction of the module, so as to envelop the tip portions or side-to-side opposite sides and be further bonded to the reverse side of the base, and
    wherein the base, support plate, and flexible printed circuit sheet are connected to the electric connector by insertion into the electric connector.

2. The optical-electrical transceiver module according to claim 1, wherein:
    the flexible printed circuit sheet is provided so that the flexible printed circuit sheet is extended over the right side of the support plate and the reverse side of the base in the axial direction of the optical-electrical transceiver module, and wherein:
    right side electric wirings and right-reverse side electric wirings formed on the flexible printed circuit sheet are alternately disposed respectively.

3. The optical-electrical transceiver module according to claim 1, wherein:
the flexible printed circuit sheet is extended over the right side of the support plate and the reverse side of the base in the width direction of the base and support plate, and wherein:
the electric wirings at the right side of the flexible printed circuit sheet and the electric wirings at the right-reverse sides of the flexible printed circuit sheet are bilaterally symmetrically disposed in the width direction of the base and support plate.

4. The optical-electrical transceiver module according to claim 1, wherein:
the optical path conversion element is comprised of an optical waveguide, and wherein:
the base is provided with a groove for mounting the optical fiber and optically coupling the core of the optical fiber and the core of the optical waveguide with each other.

5. The optical-electrical transceiver module according to claim 1, wherein:
the total thickness of the base, the support plate, and flexible printed circuit sheet extended over the right side of the support palate and the reverse side of the base, at the tip side of the support plate and the base, is set so as to fit into between upper and lower metal terminals formed in the electric connector.

6. The optical-electrical transceiver module according to claim 1, wherein:
the optical path conversion element and the optical fiber are optically coupled to each other on the right side of the base, and wherein:
the electrical wiring on the flexible printed circuit sheet and the electric wire of the optical-electrical composite cable are electrically connected with each other on the reverse side of the base.

7. An optical-electrical transceiver module for connecting an optical-electrical composite cable incorporating an optical fiber and an electric wire to a receptacle of external electrical equipment, comprising:
a base;
the optical fiber provided on the base and having an optical path conversion element provided at the external electrical equipment side of the optical fiber;
the optical path conversion element for changing a direction of an optical path;
a flexible printed circuit sheet provided on the optical path conversion element and having electrical wiring to be electrically connected to the electric wire of the optical-electrical composite cable;
an optical element provided on the flexible printed circuit sheet and optically coupled to the core of the optical fiber through the optical path conversion element;
a support plate provided on the base to support the flexible printed circuit sheet; and
an electric connector electrically connected to the electrical wiring of the flexible printed circuit sheet and connectable to the receptacle of the external electrical equipment by insertion into the receptacle, wherein:
the flexible printed circuit sheet is extended over the support plate and the base, in a state of being folded at tip portions of the support plate and the base in the axial direction of the module or at side-to-side opposite sides of the support plate and the base in the width direction of the module, so as to envelop the tip portions or side-to-side opposite sides and be further bonded to the reverse side of the base, and wherein:
the base, support plate, and flexible printed circuit sheet are connected to the electric connector by insertion into the electric connector.

8. The optical-electrical transceiver module according to claim 1, wherein:
the optical path conversion element is comprised of an optical waveguide, and the optical wave guide also serves as the support plate.

9. The optical-electrical transceiver module according to claim 2, wherein:
the optical path conversion element is comprised of an optical waveguide, and the optical wave guide also serves as the support plate.

* * * * *